United States Patent [19]

Gupta

[11] Patent Number: 5,682,398
[45] Date of Patent: Oct. 28, 1997

[54] FREQUENCY CONVERSION LASER DEVICES

[75] Inventor: Mool C. Gupta, Webster, N.Y.

[73] Assignee: Eastman Kodak Company, Rochester, N.Y.

[21] Appl. No.: 643,243

[22] Filed: May 3, 1996

[51] Int. Cl.$^6$ .................................................. H01S 3/10
[52] U.S. Cl. .................................. 372/22; 372/6; 372/101; 372/32; 372/92; 372/102; 372/9; 372/64; 372/107; 359/328
[58] Field of Search .......................... 372/22, 67, 101, 372/32, 9, 34, 36, 92, 64, 97, 107, 102; 359/328

[56] References Cited

U.S. PATENT DOCUMENTS

| | | | |
|---|---|---|---|
| 4,474,427 | 10/1984 | Hill et al. | 350/96.3 |
| 4,910,737 | 3/1990 | Payne et al. | 372/6 |
| 5,036,220 | 7/1991 | Byer et al. | 307/427 |
| 5,157,754 | 10/1992 | Bierlein et al. | 385/122 |
| 5,181,213 | 1/1993 | Shinokura et al. | 372/6 |
| 5,193,023 | 3/1993 | Yamada et al. | 359/245 |
| 5,249,250 | 9/1993 | Yamada et al. | 385/122 |
| 5,297,155 | 3/1994 | Pan et al. | 372/20 |
| 5,305,335 | 4/1994 | Ball et al. | 372/6 |
| 5,317,446 | 5/1994 | Mir et al. | 359/296 |
| 5,367,588 | 11/1994 | Hill et al. | 385/37 |
| 5,555,253 | 9/1996 | Dixon | 372/92 |

OTHER PUBLICATIONS

Yuhuan Xu, Ferroelectric Materials and Their Applications, Elsevier Science Publishers B.V. 1991, 233.
Boyd, Nonlinear Optics, 1992, Chapter 1.

*Primary Examiner*—Leon Scott, Jr.
*Attorney, Agent, or Firm*—Raymond L. Owens

[57] ABSTRACT

A frequency converting laser device is disclosed which includes a laser diode adapted to produced an output laser beam and an optical fiber coupled to the output of the laser diode and including a built-in grating in the optical fiber arranged so as to provide a beam having a specific wavelength and to reflect a small portion of such beam back into the laser diode while transmitting the beam so that the laser diode will produce a beam of that wavelength. The device further includes a frequency converting structure adapted to receive the transmitted beam of light and to change the frequency of the input beam to produce the output beam at the specific frequency.

14 Claims, 2 Drawing Sheets

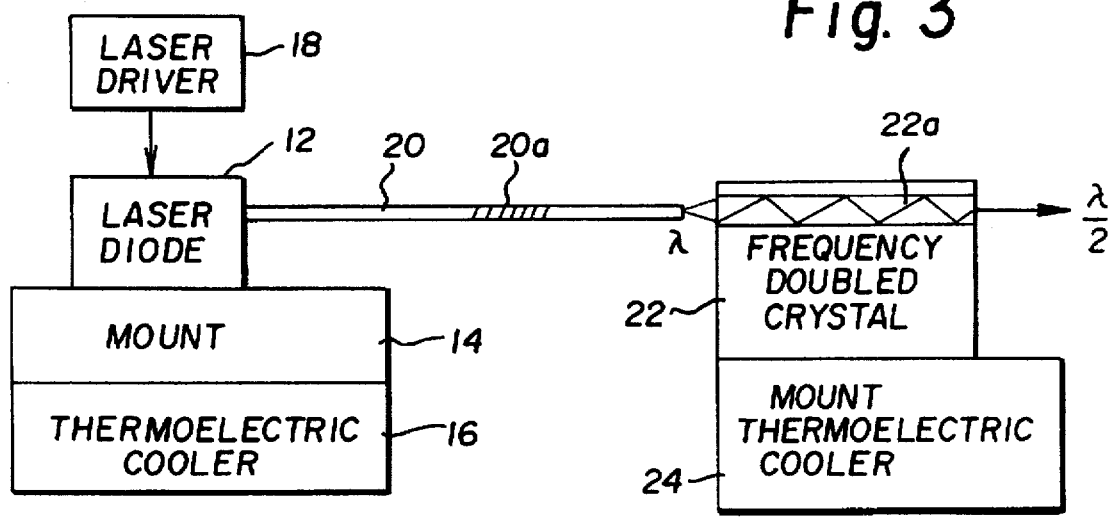
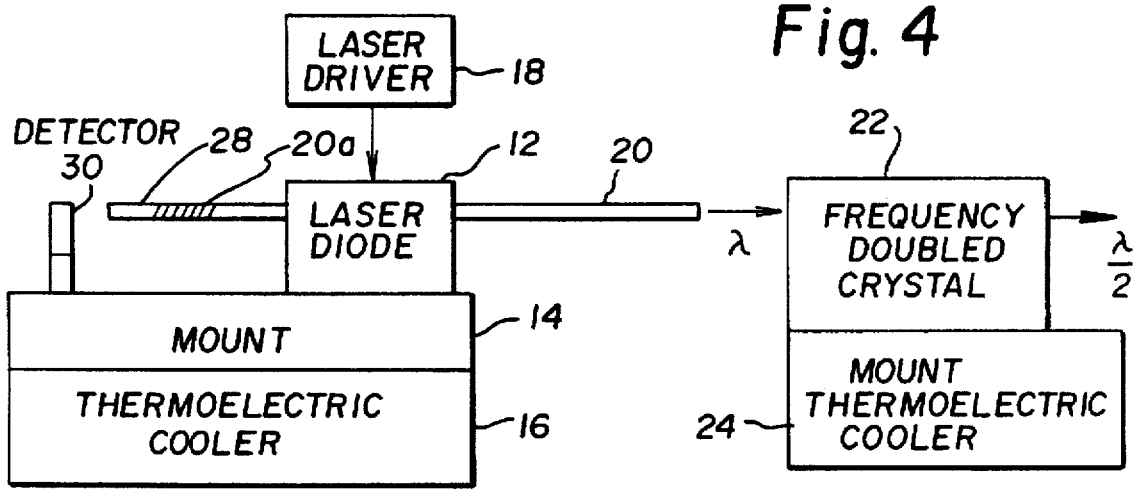
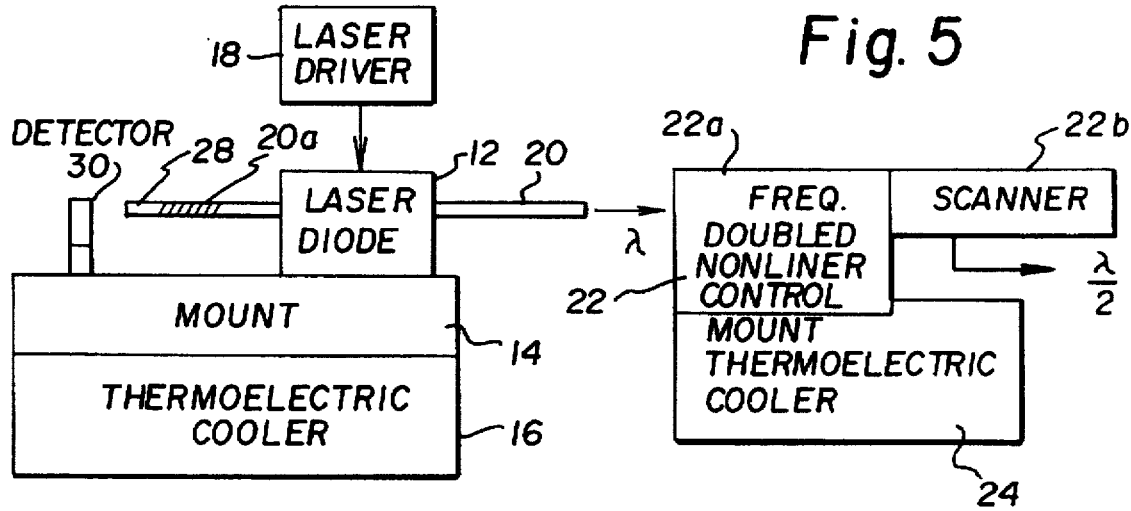

FREQUENCY CONVERSION LASER DEVICES

CROSS-REFERENCE TO RELATED APPLICATIONS

Reference is made herein to commonly assigned U.S. patent application Ser. No. 08/561,141 filed Nov. 21, 1995 to Baron et al entitled "Forming Inverted Ferroelectric Domain Regions", the disclosure of which is incorporated herein by reference.

FIELD OF THE INVENTION

The present invention relates to frequency converting laser devices.

BACKGROUND OF THE INVENTION

Frequency converting laser devices such as doubling devices are used in a number of applications such as optical heads for information storage, printing devices, scanners, displays, and instrumentation. Typically a beam of light of a narrow wavelength illuminates a nonlinear crystal which doubles the output frequency of the light, for example, typically the input light beam can be an infrared region and the output light will be in the visible portion of the spectrum. For example, if a 980 nm laser wavelength light is passed through a nonlinear crystal such as $LiTaO_3$ then blue wavelength light of 490 nm can be achieved. For efficient conversion of frequency doubled light the so-called phase matching conditions have to be satisfied. Various methods are used to satisfy the phase matching condition. These methods include passing light through nonlinear crystal at specific angle or passing light through a periodically arranged zones of inverted polarity of ferroelectric domains in the crystal. In such cases the specific angle used for passing light through the crystal or the period of the inverted polarity zones determines the specific wavelength of the incident light that can be phase matched. In general, the phase matching wavelength has to be very precise and any deviation from the optimum value will cause significant loss of frequency doubled light or even could occur essentially a complete loss. Typically, the wavelength of the laser has to stay with in a fraction of a 1 nm from the optimum phase matching wavelength. For example, if input laser beam wavelength is 980 nm for optimum phase matching condition then any deviation such as 979 or 981 nm could destroy the phase matching condition. This requirement puts a stringent condition on input laser sources for frequency doubled light.

If an ordinary semiconductor laser is used for the light source, then wavelength fluctuations due to temperature or light feedback to laser could make the frequency of the output beam unsuitable for frequency converting laser device structures. Some schemes such as putting a bulk grating in the optical path to wavelength stabilize the laser have been discussed. But these are harder to use for alignment purposes and are bulky making devices very expensive and inconvenient. Other laser sources such as distributed feedback (DFB), Distributed Bragg reflected (DBR) lasers can be used for frequency converting laser devices. These lasers are harder to fabricate and very expensive and draw significant amount of current to achieve significant power from these lasers.

SUMMARY OF THE INVENTION

An object of the present invention is to provide an improved frequency converting laser device which overcomes problems associated with laser sources and which facilitates the use of inexpensive laser diodes.

These objects are achieved in a frequency converting laser device, comprising:

a) a laser diode adapted to produce an output laser beam;

b) an optical fiber coupled to the output of the laser diode and including a built-in grating in the optical fiber arranged so as to provide a beam having a specific wavelength and to reflect a small portion of such beam back into the laser diode while transmitting the beam so that the laser diode will produce a beam of that wavelength; and c) a frequency converting structure adapted to receive the transmitted beam of light and to change the frequency of the input beam to produce the output beam at the specific frequency.

Advantages

An advantage of the present invention is that it permits the use of an inexpensive laser diode light source in a frequency converting laser device. Laser diode devices have heretofore been unsuitable for use in frequency doubling since their output includes many wavelengths of light.

Another advantage of the present invention is that it permits a compact solid state laser source to be used in a laser frequency doubling device.

A still further advantage of this invention is that it is compact, relatively lower cost and provides various flexibility in making frequency doubling device.

BRIEF DESCRIPTION OF THE DRAWINGS

FIG. 3 shows a frequency conversion laser device similar to FIG. 1 with a waveguide structure provided on a frequency doubling crystal;

FIG. 4 shows another embodiment of the invention with two separate fiber optics connected to a laser diode; and FIG. 5 shows an embodiment similar to FIG. 4 with an integrated frequency doubling and scanner structure.

DETAILED DESCRIPTION OF THE INVENTION

In accordance with the present invention, laser diodes can be used in frequency converting laser devices. The present invention makes use of optical fibers which receive the output of a semiconductor laser diode. The optical fibers are single mode fibers. A grating is formed inside the core of the fiber by ultraviolet light exposure. The grating inside the fiber reflects a small fraction of light of particular wavelength to the semiconductor laser to lock the wavelength of the semiconductor laser. Such lasers are now commercially available for optical communication application. Here we describe a frequency doubling laser device using such fiber lasers.

Figure 1:
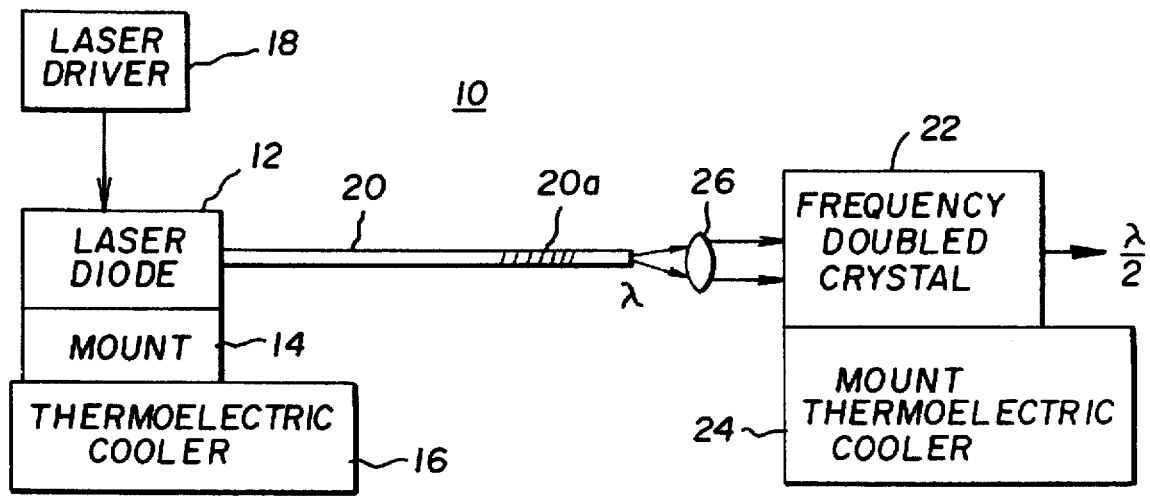
FIG. 1 shows a frequency conversion laser device in accordance with the present invention.

In FIG. 1 there is provided an output laser frequency doubling device 10 where a single mode semiconductor laser diode 12 is mounted on a heat conducting mount 14 and its temperature is controlled by a thermoelectric cooler 16. A laser driver 18 provides the appropriate voltage and current for the semiconductor laser diode 12 to provide laser light emission. An optical fiber 20 is shown fixed to the output of the laser diode and is a single mode fiber. The optical fiber 20 has a built-in grating 20a inside its core area. The index of refraction of the optical fiber can be controlled by stressing the optical fiber or by changing the temperature of the fiber. In this way, small changes can be made in the frequency of the light produced by the laser diode. These optical fibers, which include gratings, are well known in the art and for discussion of their operation in connection with a single mode layer, reference is made to U.S. Pat. Nos. 4,474,427 and 5,367,588, the disclosures of which are incorporated by reference herein.

A frequency doubling structure 22 is mounted on a substrate which could be mounted on a thermoelectric cooler 24. The output light from the optical fiber 20 is collimated by a lens 26 and passes through the frequency doubling structure 22 which upconverts the frequency of the light. For example, if the input light is in the infrared region, the output light will be in the blue region of the spectrum. In other words, the frequency is doubled. By using an optical fiber 20, the light beam from the semiconductor laser diode 12 does not diverge over the length of the optical fiber 20.

Frequency doubling structures are well known in the art and may take a number of different forms. Single crystal materials such as LiNbO₃, LiTaO₃, and KTP have been used in the past for frequency doubling. See, for example, Yuhuan Xu, Ferroelectric Materials and Their Applications, Elsevier Science Publishers B.V. 1991, 233. Moreover, inverted ferroelectric domain regions can also be used to double the frequency of input light. See, for example, the above-reference commonly assigned Baron et al application. For further examples of disclosures of devices which use ferroelectric domain structures to provide a frequency doubling function, see U.S. Pat. Nos. 5,157,754 issued Oct. 20, 1992 to Bierlein et al; 5,193,023 issued Mar. 9, 1993 to Yamada et al; 5,249,250 issued Sep. 28, 1993 to Yamada et al, and the above cross-referenced commonly assigned Baron et al patent application, the disclosures of which are incorporated hereinby reference.

Although the present invention describes frequency doubling device based on nonlinear crystals. It will be understood by those skilled in the art that the present invention is applicable to higher harmonic generations, sum frequency generation, difference frequency generation, optical parametric oscillation using nonlinear crystal, and optical fiber laser. See, for example, Chapter 1 of Boyd, *Nonlinear Optics* (1992).

Figure 2:
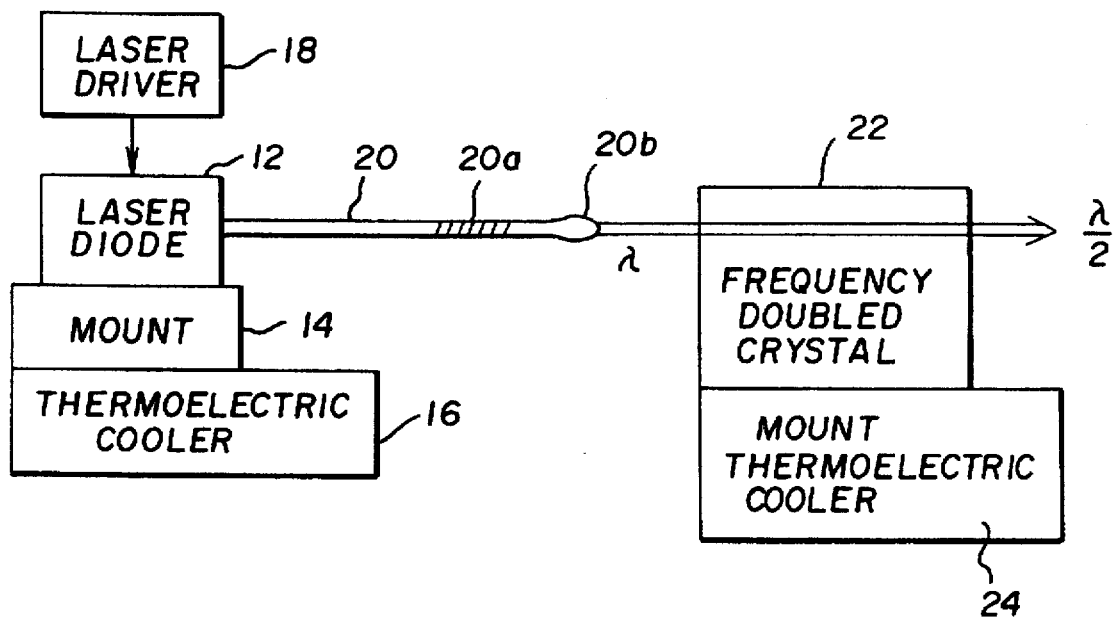
FIG. 2 shows a frequency conversion laser device similar to FIG. 1 with a lens being formed on the end of an optical fiber.

In FIG. 2 instead of using a external lens to collimate the output of the optical fiber 20, a lens 20b is built-in at the end of the optical fiber 20 by modifying the end of the optical fiber in the shape of a lens so that a collimated or focusing beam emerges from the optical fiber 20. This eliminates the need for an external lens and the difficulty of lens alignment.

The frequency doubling structure 22 can also be waveguide type nature where a light beam is confined into small cross sectional areas say of a few microns by a few microns. For an example of a frequency doubling structure which uses such a waveguide, reference is made to U.S. Pat. No. 5,036,220 issued Jul. 30, 1991 to Byer et al, the disclosure of which is incorporated herein by reference. It is particularly effective to use such a waveguide structure with optical fibers so they can be made of small dimensions and single mode optical fibers can be sized to be compatible with the waveguide structure so that efficient coupling can be achieved.

In FIG. 3 a waveguide 22a is included as part of the frequency doubling structure 22. It is preferable that the waveguide 22a be made of a nonlinear crystal. For optimum coupling efficiency the optical fiber end could also be used with a lens such as shown in FIG. 2. Alternatively, a lens such as shown in FIG. 1 could also be used.

Turning now to FIG. 4, another embodiment of the invention is shown. In this arrangement, a separate optical fiber 28 is placed on the back facet of the semiconductor laser diode 12 to control the wavelength of the emitted light and the optical fiber 20 is still included on the front end of the laser. However, the optical fiber 28 includes the built-in grating 20a as the optical fiber 20 does not. In this arrangement, a detector 30 receives light from the optical fiber 28 and can be used to measure and control laser power as is well understood in the art.

In FIG. 5 another embodiment of the invention is shown. In this embodiment, the structure is the same as shown in FIG. 4 with the exception that the frequency doubling structure 22 which includes integrated on the doubling crystal a frequency doubling structure 22 and a scanner 22b. In this embodiment, the frequency doubled light can be deflected by scanner 22b by the application of an electric field using the phenomenon of electro-optic (e-o) effect. Reference is made to commonly assigned U.S. patent application Ser. No. 08/645,973 filed May 14, 1996 to Gupta et al; U.S. Pat. No. 5,317,446 issued May 31, 1994 to Mir et al; and U.S. patent application Ser. No. 60/005,171 filed Oct. 13, 1995 to Gopalan et. al, the disclosures of which are hereby incorporated by reference.

The present invention is particularly suitable for use in a number of applications such as, for example, optical storage heads, print heads, projection displays, beam scanning apparatus, and other optical instruments.

The invention has been described in detail with particular reference to certain preferred embodiments thereof, but it will be understood that variations and modifications can be effected within the spirit and scope of the invention.

| PARTS LIST | |
|---|---|
| 10 | output laser frequency doubling device |
| 12 | semiconductor laser diode |
| 14 | heat conducting mount |
| 16 | thermoelectric cooler |
| 18 | laser driver |
| 20 | optical fiber |
| 20a | built-in grating |
| 20b | lens |
| 22 | frequency doubling structure |
| 22a | waveguide |
| 22b | scanner |
| 24 | thermoelectric cooler |
| 26 | lens |
| 28 | optical fiber |
| 30 | detector |

I claim:

1. A frequency converting laser device, comprising:

a) a laser diode adapted to produce an output laser beam;

b) an optical fiber coupled to the output of the laser diode and including a built-in grating in the optical fiber arranged so as to provide a beam having a specific wavelength and to reflect a small portion of such beam back into the laser diode while transmitting the beam so that the laser diode will produce a beam of that wavelength; and c) a frequency converting structure adapted to receive the transmitted beam of light and to change the frequency of the input beam to produce the output beam at the specific frequency.

2. The frequency converting laser device of claim 1 further including at least one lens disposed between the frequency doubling structure and the output of the optical fiber to transmit the beam into the frequency doubling crystal.

3. The frequency converting laser device of claim 1 wherein the output portion of the optical fiber is shaped in the form of a lens so as to transmit the beam into the frequency converting structure.

4. The frequency converting laser device of claim 1 wherein the frequency converting structure includes a nonlinear frequency doubling crystal and a waveguide formed on the surface of the nonlinear crystal.

5. The frequency converting laser device of claim 4 wherein the frequency doubling structure includes a crystal with inverted domain portions.

6. The frequency converting laser device of claim 1 further including means for changing the index of refraction of the optical fiber to tune the output frequency of the transmitted beam.

7. A frequency converting laser device, comprising:
  a) a laser diode adapted to produce two spaced output beams;
  b) first and second optical fibers coupled to each output beam of the laser diode, the first optical fiber including a built-in grating in the first optical fiber arranged so as to provide a beam having a specific wavelength and to reflect a small portion of such beam back into the laser diode so that the laser diode will produce a beam of that wavelength, the second optical fiber transmitting the output beam which has a specific wavelength; and
  c) a frequency converting structure adapted to receive the transmitted beam of light and to change the frequency of the input beam to produce the output beam at the specific frequency.

8. The frequency converting laser device of claim 7 further including at least one lens disposed between the frequency converting structure and the output of the second optical fiber to transmit the beam into the frequency converting structure.

9. The frequency converting laser device of claim 7 wherein the output portion of the first optical fiber is shaped in the form of a lens so as to transmit the beam into the frequency converting structure.

10. The frequency converting laser device of claim 7 further including a nonlinear frequency doubling crystal and a waveguide formed on the surface of the crystal.

11. The frequency converting laser device of claim 10 wherein the frequency doubling structure includes a crystal with inverted domain portions.

12. The frequency converting laser device of claim 7 further including means for changing the index of refraction of the optical fiber to tune the output frequency of the transmitted beam.

13. The frequency converting laser device of claim 7 further including means for controlling the operating temperature of the laser diode and the frequency convering structure.

14. A frequency converting laser device, comprising:
  a) a laser diode adapted to produce two spaced output beams;
  b) first and second optical fibers coupled to each output beam of the laser diode, the first optical fiber including a built-in grating in the first optical fiber arranged so as to provide a beam having a specific wavelength and to reflect a small portion of such beam back into the laser diode so that the laser diode will produce a beam of that wavelength, the second optical fiber transmitting the output beam which has a specific wavelength; and
  c) a integrated frequency converting structure and a scanner adapted to receive the transmitted beam of light from the second optical fiber and for converting the frequency of the transmitted output beam and deflecting the converted light beam through an electronically controlled angle in response to the application of an electric field.

* * * * *